United States Patent
Murata

(10) Patent No.: US 10,193,535 B2
(45) Date of Patent: Jan. 29, 2019

(54) OSCILLATION CIRCUIT, BOOSTER CIRCUIT, AND SEMICONDUCTOR DEVICE

(71) Applicant: SII Semiconductor Corporation, Chiba-shi, Chiba (JP)

(72) Inventor: Masaya Murata, Chiba (JP)

(73) Assignee: ABLIC INC., Chiba (JP)

( * ) Notice: Subject to any disclaimer, the term of this patent is extended or adjusted under 35 U.S.C. 154(b) by 159 days.

(21) Appl. No.: 15/460,906

(22) Filed: Mar. 16, 2017

(65) Prior Publication Data

US 2017/0272060 A1     Sep. 21, 2017

(30) Foreign Application Priority Data

Mar. 18, 2016  (JP) ................. 2016-055584

(51) Int. Cl.
| | |
|---|---|
| H03K 3/011 | (2006.01) |
| H03K 3/012 | (2006.01) |
| H03K 3/03 | (2006.01) |
| H03K 19/0185 | (2006.01) |
| G11C 5/14 | (2006.01) |
| H02M 3/07 | (2006.01) |

(52) U.S. Cl.
CPC ............. *H03K 3/012* (2013.01); *G11C 5/145* (2013.01); *H03K 3/011* (2013.01); *H03K 3/0315* (2013.01); *H03K 19/018507* (2013.01); *H02M 3/073* (2013.01)

(58) Field of Classification Search
CPC ...... H03K 3/011; H03K 3/012; H03K 3/0315; H03K 3/0322; H03L 7/0995
USPC ........................................................... 331/57
See application file for complete search history.

(56) References Cited

U.S. PATENT DOCUMENTS

| | | | | |
|---|---|---|---|---|
| 4,358,728 | A * | 11/1982 | Hashimoto | ............ G04G 19/06 323/275 |
| 5,465,075 | A * | 11/1995 | Yaklin | ................. H03D 13/004 331/17 |
| 5,952,892 | A * | 9/1999 | Szajda | ................. H03K 3/0231 327/157 |
| 6,188,293 | B1 | 2/2001 | Miyagi et al. | |
| 9,112,484 | B1 * | 8/2015 | Clark | ................... H03K 3/0315 |
| 2013/0221344 | A1 * | 8/2013 | Ohmaru | ............. H01L 27/1225 257/43 |

\* cited by examiner

*Primary Examiner* — Levi Gannon
(74) *Attorney, Agent, or Firm* — Brinks Gilson & Lione

(57) ABSTRACT

Provided are an oscillation circuit, a booster circuit, and a semiconductor device capable of reducing power consumption when a power supply voltage is high. In a ring oscillator circuit which is the oscillation circuit, a PMOS transistor in each of inverter circuits has a substrate connected to a first power supply voltage, and a source connected to a drain of a PMOS transistor, which is a first constant current element configured to control a supply current to the inverter circuit, and the PMOS transistor, which is the first constant current element, has a source connected to a second power supply voltage VREG, which serves as a constant voltage when the first power supply voltage is at a predetermined voltage or higher.

4 Claims, 5 Drawing Sheets

OSCILLATION CIRCUIT, BOOSTER CIRCUIT, AND SEMICONDUCTOR DEVICE

RELATED APPLICATIONS

This application claims priority under 35 U.S.C. § 119 to Japanese Patent Application No. 2016-055584 filed on Mar. 18, 2016, the entire content of which is hereby incorporated by reference.

BACKGROUND OF THE INVENTION

1. Field of the Invention

The present invention relates to an oscillation circuit capable of reducing power consumption when a power supply voltage is high.

2. Description of the Related Art

In a non-volatile memory, for example, an EEPROM, which allows data to be electrically erased, written, or read out, there is a need to apply a high voltage, which is the same as or higher than a power supply voltage VDD, to a selected memory cell in the erasing and writing operation. A desired high voltage is generated through use of a charge pump circuit configured to boost an input voltage.

An output current of a booster circuit using the charge pump circuit is expressed by Expression (1):

$$IOUT = \frac{CCP \times VCLK}{TCLK} = fCLK \times CCP \times VDD \qquad (1)$$

where TCLK represents an oscillation cycle of a clock signal of an oscillation circuit, fCLK represents an oscillation frequency of the output clock signal of the oscillation circuit, CCP represents a capacitance of a capacitor of the charge pump circuit, and VCLK represents an amplitude of the clock signal, that is, the power supply voltage VDD.

Based on Expression (1), an output current IOUT supplied to the memory cell is in proportion to the power supply voltage VDD. Thus, the output current IOUT is excessively supplied when the power supply voltage is high. As a result, there is a problem in that current consumption and power consumption are largely increased.

In order to solve this problem, the following technology is proposed (for example, see Japanese Patent No. 3553508).

FIG. 5 is a circuit diagram for illustrating an example of a related-art oscillation circuit.

The related-art oscillation circuit is a ring oscillator circuit in which odd stages of inverter circuits 3, each of which includes a PMOS transistor and an NMOS transistor that are connected to each other in series, are cascade connected to form a ring. Constant current elements 2 are each connected to each of the inverter circuits 3. Each of the constant current elements 2 are connected to a power supply circuit 1.

Charges Q that are charged to and discharged from a gate capacitance $C_g$ of each of the inverter circuits 3 forming the ring oscillator circuit are expressed by Expression (2):

$$Q = C_g \times VDD = IBIAS \times t \qquad (2)$$

where IBIAS represents a charge and discharge current, and t represents charge and discharge time.

By deforming Expression (2), the charge and discharge time t and the oscillation frequency fCLK are expressed by Expression (3) and Expression (4), respectively.

$$t = \frac{C_g \times VDD}{IBIAS} \qquad (3)$$

$$fCLK = \frac{1}{2 \times t} = \frac{IBIAS}{2 \times C_g \times VDD} \qquad (4)$$

In a power supply voltage region sufficient for the power supply circuit 1 to stably operate, the charge and discharge current IBIAS is determined by the constant current elements 2. The charge and discharge current IBIAS is considered to be constant regardless of the power supply voltage VDD. Thus, the gate capacitance $C_g$ of each of the inverter circuits 3 and the charge and discharge current IBIAS are considered to be constants. From Expression (3) and Expression (4), the charge and discharge time t is in proportion to the power supply voltage VDD, and the oscillation frequency fCLK is in inverse proportion to the power supply voltage VDD.

Through use of the oscillation circuit 10 configured as above, the oscillation frequency fCLK may be reduced when the power supply voltage VDD rises. The output current IOUT may be suppressed, to thereby enable low current consumption and low power consumption.

However, in recent years, the power supply voltage of a semiconductor device is increasingly reduced. Therefore, in a semiconductor device having the booster circuit, it is required to operate at a low voltage while maintaining low current consumption and low power consumption.

SUMMARY OF THE INVENTION

In order to solve the above-mentioned problems, according to one embodiment of the present invention, in a ring oscillator circuit which is the oscillation circuit, a PMOS transistor in each of inverter circuits has a substrate connected to a power supply voltage VDD. The PMOS transistor in each of the inverter circuits has a source connected to a drain of a PMOS transistor, which is a first constant current element configured to control a supply current to the inverter circuit. The PMOS transistor, which is the first constant current element, has a source connected to a second power supply voltage VREG, which serves as a constant voltage when the power supply voltage VDD is a predetermined voltage or higher.

According to the present invention, by using the ring oscillator circuit of the oscillation circuit configured as above, when the power supply voltage is higher than the predetermined voltage, a potential difference is generated between the source and the substrate of the PMOS transistor in each of the inverter circuits. Due to a substrate bias effect, a threshold voltage rises, and an inversion time of the inverter circuits, that is, a charge and discharge time t becomes longer than that of the related art. The oscillation frequency can be more reduced than the related art and a reduction in current consumption and power consumption can be achieved.

DETAILED DESCRIPTION OF THE PREFERRED EMBODIMENTS

Now, an embodiment of the present invention is described with reference to the drawings.

Figure 1:
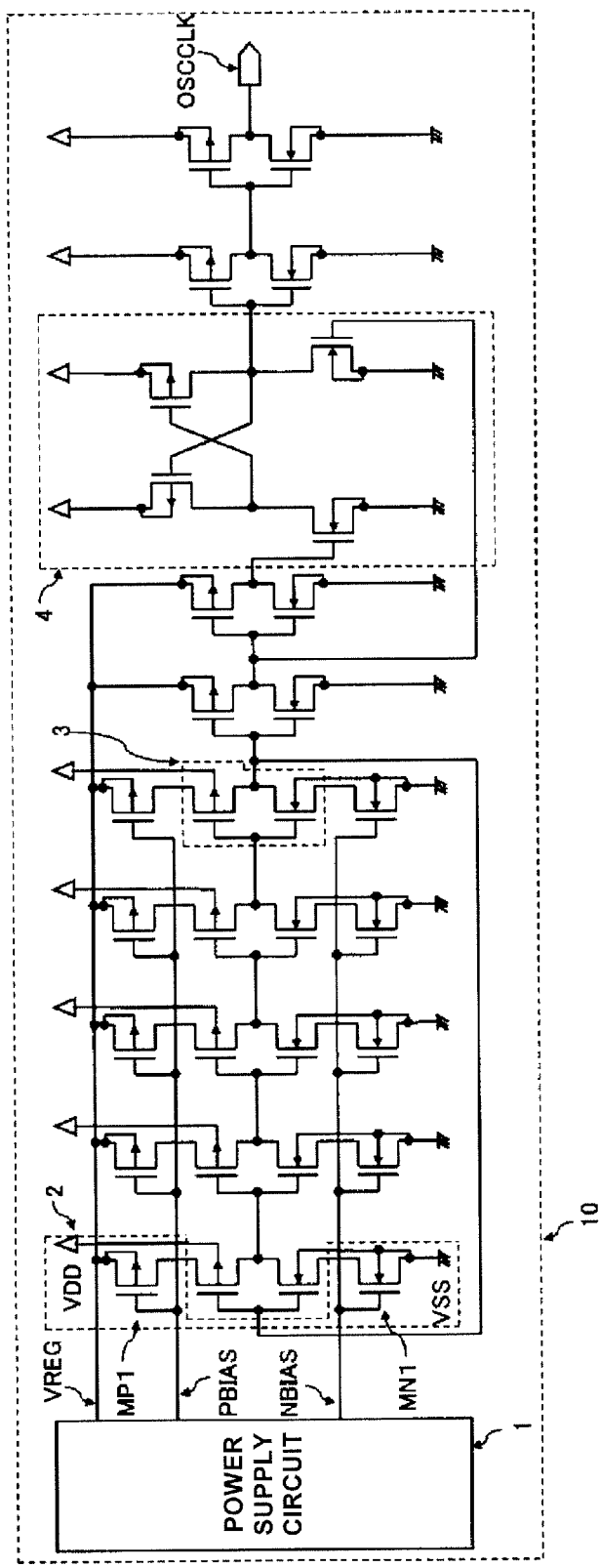
FIG. 1 is a circuit diagram for illustrating an example of an oscillation circuit of an embodiment of the present invention.

FIG. 1 is a circuit diagram for illustrating an example of an oscillation circuit 10 of this embodiment. In a ring oscillator circuit, odd stages of inverter circuits 3, each of which includes a PMOS transistor and an NMOS transistor that are connected to each other in series, are cascade connected to form a ring. Constant current elements 2 are each connected to each of the inverter circuits 3. Each of the constant current elements 2 are connected to a power supply circuit 1. The PMOS transistor in each of the inverter circuits 3 has a substrate connected to a power supply voltage VDD. The PMOS transistor in each of the inverter circuits 3 has a source connected to a drain of a PMOS transistor MP1, which is a first constant current element configured to control a supply current. The PMOS transistor MP1 has a gate to which a bias voltage PBIAS output from the power supply circuit 1 is input, a source and a substrate to which a second power supply voltage VREG is input, and the drain connected to a source of the PMOS transistor in each of the inverter circuits 3. An NMOS transistor in each of the inverter circuits 3 has a substrate connected to a ground potential VSS, and a source connected to a drain of an NMOS transistor MN1, which is a second constant current element configured to control the supply current to the inverter circuit 3. The NMOS transistor MN1 has a gate to which a bias voltage NBIAS output from the power supply circuit 1 is input, a source and a substrate connected to the ground potential VSS, and the drain connected to a source of the NMOS transistor in each of the inverter circuits 3.

Figure 2:
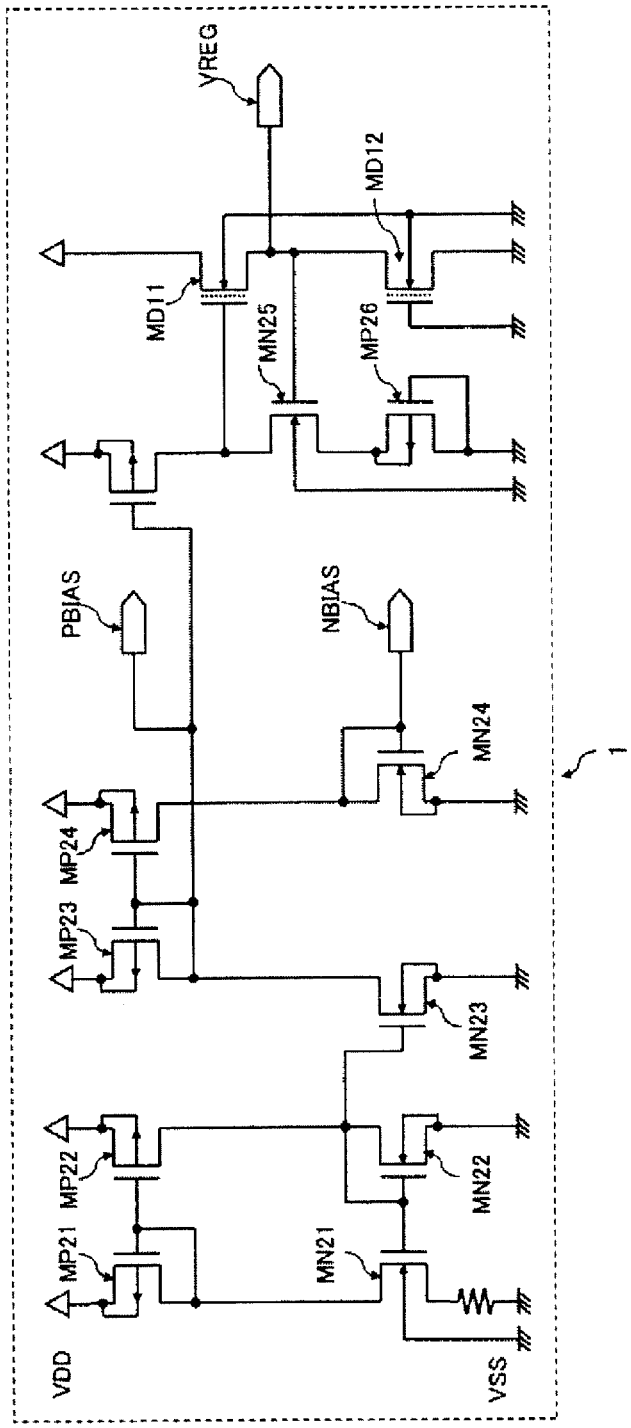
FIG. 2 is a circuit diagram for illustrating an example of a power supply circuit in the oscillation circuit of this embodiment.

FIG. 2 is a circuit diagram for illustrating an example of the power supply circuit 1 in the oscillation circuit 10 of this embodiment.

A constant current source IREF is formed of four transistors, that is, a PMOS transistor MP21, a PMOS transistor MP22, an NMOS transistor MN21, and an NMOS transistor MN22, and a resistor. A constant current IREF is supplied to a PMOS transistor MP23 through a current mirror circuit formed of the NMOS transistor MN22 and an NMOS transistor MN23. The constant current IREF is supplied to an NMOS transistor MN24 through a current mirror circuit formed of the PMOS transistor MP23 and a PMOS transistor MP24.

The bias voltage PBIAS is output from a drain of the PMOS transistor MP23. Further, the bias voltage NBIAS is output from a drain of the NMOS transistor MN24.

The second power supply voltage VREG is a sum of a threshold voltage |Vtp| of a PMOS transistor MP26, which has a gate and a drain forming a saturation connection, and a threshold voltage Vtn of an NMOS transistor MN25. Depletion-type NMOS transistors MD11 and MD12 are configured to convert an output impedance of the second power supply voltage VREG as a source follower.

Figure 3:
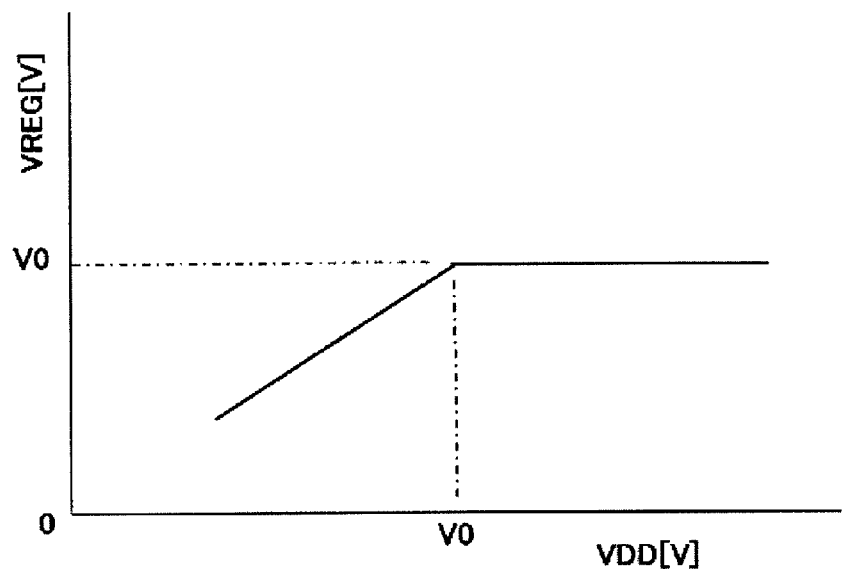
FIG. 3 is a graph for showing a relationship between a power supply voltage VREG and a power supply voltage VDD of this embodiment.

FIG. 3 is a graph for showing a relationship between the second power supply voltage VREG and the power supply voltage VDD of this embodiment.

A voltage V0 in FIG. 3 is a voltage determined by the sum of the threshold voltage |Vtp| of the PMOS transistor MP26, which has the gate and the drain forming the saturation connection, and the threshold voltage Vtn of the NMOS transistor MN25 illustrated in FIG. 2. In a region in which the power supply voltage VDD is lower than the voltage V0, the second power supply voltage VREG is approximately equal to the power supply voltage VDD. In a region in which the power supply voltage VDD is higher than the voltage V0, the second power supply voltage VREG is a constant voltage at the predetermined voltage V0.

When the power supply voltage VDD is higher than the predetermined voltage V0 (VDD>V0), a potential difference is generated between the power supply voltage VDD and the second power supply voltage VREG. A potential difference is generated between the source and the substrate of the PMOS transistor in each of the inverter circuits 3, with the result that a forward bias voltage Vsb is applied between the source and the substrate. In the PMOS transistor, a depletion layer below a channel is expanded by the forward bias voltage Vsb. Then, holes in a channel region are reduced to reduce a thickness of the channel. In order for the channel to have its original thickness, there is a need to apply a higher gate-source voltage Vgs. As a result, the threshold voltage increases. Such increase in the threshold voltage due to the potential difference between the source and the substrate is referred to as "substrate bias effect".

When the power supply voltage VDD becomes higher than the predetermined voltage V0, the threshold voltage of the PMOS transistor in each of the inverter circuits 3 increases more due to the substrate bias effect. An inversion time of the inverter circuits 3, that is, a charge and discharge time t is longer than that in the related art, and thus an oscillation frequency fCLK is lower than the related art. As the power supply voltage VDD becomes higher than the predetermined voltage V0, a potential difference between the power supply voltage VDD and the second power supply voltage VREG becomes larger. The decrease in the oscillation frequency fCLK due to the substrate bias effect becomes more obvious.

In the oscillation circuit 10 of this embodiment, an amplitude of the ring oscillator circuit is the second power supply voltage VREG, and thus there is a need to level-convert an amplitude of an output OSCCLK of the oscillation circuit 10 to the power supply voltage VDD through a level shift circuit 4 illustrated in FIG. 1.

As described above, in the ring oscillator circuit of FIG. 1, the substrate of the PMOS transistor in each of the inverter circuits 3 is connected to the power supply voltage VDD. The source of the PMOS transistor in each of the inverter circuits 3 is connected to the drain of the PMOS transistor, which is the first constant current element configured to control the supply current to the inverter circuit 3. The source of the PMOS transistor, which is the first constant current element, is connected to the second power supply voltage VREG. Due to the substrate bias effect in the PMOS transistor in each of the inverter circuits 3, when the power supply voltage VDD is higher than the second power supply voltage VREG (VDD>VREG), the inversion time of the inverter circuits 3, that is, the charge and discharge time t is longer than that in the related art. The oscillation circuit 10 of this embodiment is capable of reducing the oscillation frequency fCLK in a high power supply voltage region and enables reduction in current consumption and power consumption.

Figure 4:
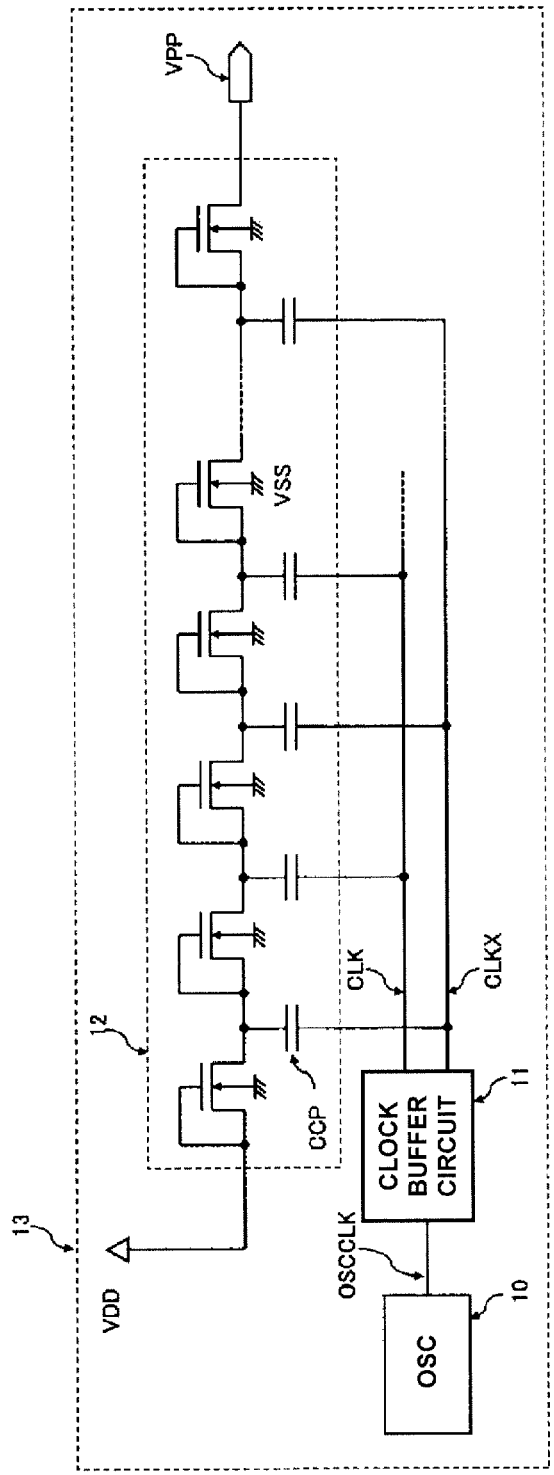
FIG. 4 is a circuit diagram for illustrating an example of a booster circuit of this embodiment.
Figure 5:
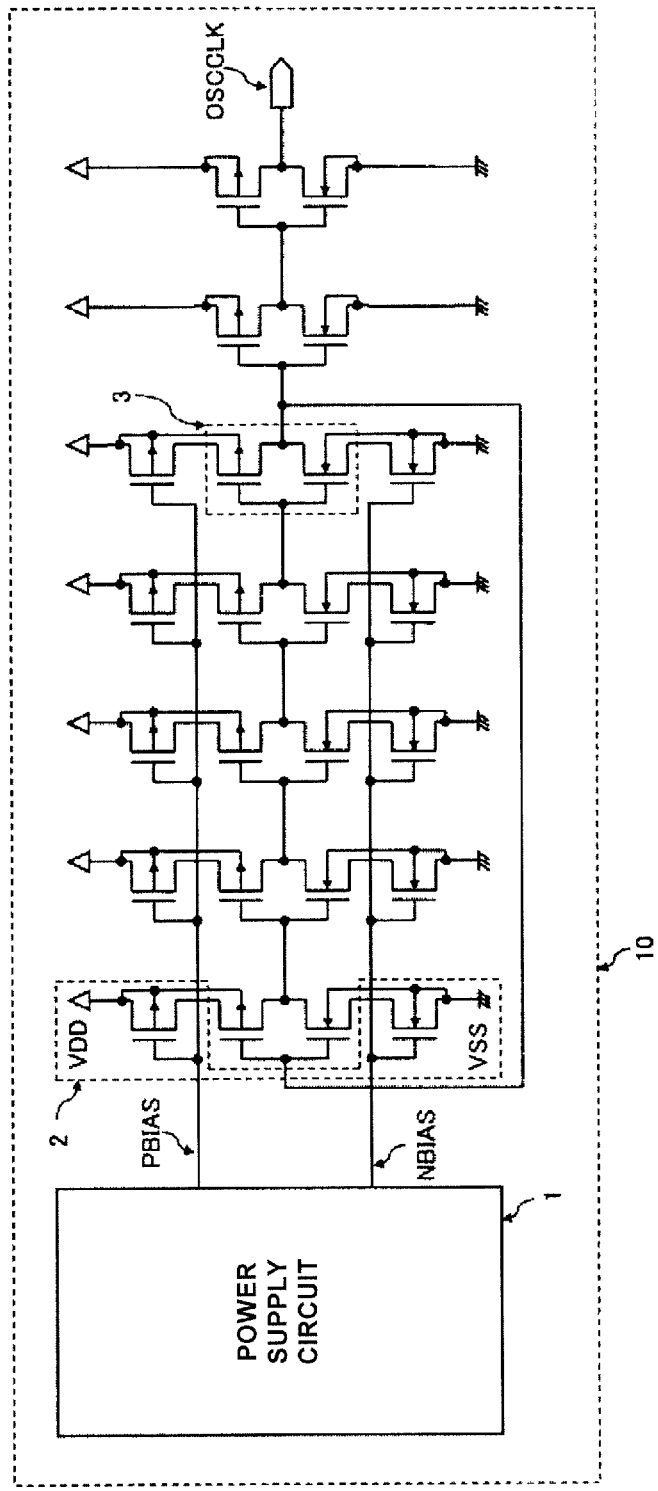
FIG. 5 is a circuit diagram for illustrating an example of a related-art oscillation circuit.

FIG. 4 is circuit diagram for illustrating an example of a booster circuit 13 of this embodiment. The oscillation output OSCCLK of the oscillation circuit 10 is used to drive a clock buffer circuit 11. Charges stored in each of capacitors CCP are pushed out by complementary clock signals CLK and CLKX in only one direction through NMOS transistors for charge transportation in the charge pump circuit 12. The complementary clock signals CLK and CLKX each have an amplitude of VDD, and the NMOS transistors for charge transportation each have a gate and a drain that are diode-connected. At this time, a potential of each of the capacitors CCP is raised through coupling operation, and the charges are sent to a capacitor in the next stage through each of the NMOS transistors for charge transportation that is connected to each of the capacitors CCP. By repeating such pumping operation, the power supply voltage VDD is boosted to a desired high voltage VPP.

As described above, when data is erased from or written in a non-volatile memory, for example, an EEPROM, which allows data to be electrically erased or written, there is a need to apply a high voltage, which is the same as or higher than the power supply voltage VDD, to a selected memory cell. By using the oscillation circuit and the charge pump circuit of this embodiment when the high voltage is needed for erasing and writing of the data, a memory element in which current consumption and power consumption are more reduced than the related art can be obtained.

The embodiment of the present invention is described above, but the present invention is not limited to the embodiment, and the present invention can be implemented in various modes that fall within the gist thereof.

What is claimed is:

1. An oscillation circuit, comprising:
   a ring oscillator circuit in which odd stages of inverter circuits, each of which includes a PMOS transistor and an NMOS transistor that are connected to each other in series, are cascade connected such that the inverter circuits are connected to form a ring;
   a first constant current element formed of a PMOS transistor configured to cause a predetermined current to flow to the inverter circuits;
   a second constant current element formed of an NMOS transistor configured to cause a predetermined current to flow to the inverter circuits; and
   a power supply circuit configured to generate a first bias voltage, a second bias voltage, and a second power supply voltage from a first power supply voltage,
   the second power supply voltage being a constant voltage when the first power supply voltage is at a predetermined voltage or higher,
   the PMOS transistor in each of the inverter circuits including a source connected to a drain of the PMOS transistor, which is the first constant current element, and a substrate to which the first power supply voltage is input,
   the NMOS transistor in each of the inverter circuits including a source connected to a drain of the NMOS transistor, which is the second constant current element, and a substrate to which a ground voltage is input,
   the PMOS transistor, which is the first constant current element, including a gate to which the first bias voltage is input, and a source and a substrate to which the second power supply voltage is input,
   the NMOS transistor, which is the second constant current element, including a gate to which the second bias voltage is input, and a source and a substrate to which the ground voltage is input.

2. An oscillation circuit according to claim 1, further comprising a level shift circuit configured to convert an output voltage of the ring oscillator circuit to the first power supply voltage.

3. A booster circuit, comprising the oscillation circuit of claim 1.

4. A semiconductor device, comprising the booster circuit of claim 3.

* * * * *